US006751322B1

(12) United States Patent
Carlbom et al.

(10) Patent No.: US 6,751,322 B1

(45) Date of Patent: Jun. 15, 2004

(54) ACOUSTIC MODELING SYSTEM AND METHOD USING PRE-COMPUTED DATA STRUCTURES FOR BEAM TRACING AND PATH GENERATION

(75) Inventors: Ingrid B. Carlbom, Summit, NJ (US); Gary W. Elko, Summit, NJ (US); Thomas A. Funkhouser, Pennington, NJ (US); Sarma V. Pingali, Basking Ridge, NJ (US); Man Mohan Sondhi, Mountain Lakes, NJ (US); James Edward West, Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/165,312

(22) Filed: Oct. 2, 1998

Related U.S. Application Data

(60) Provisional application No. 60/060,946, filed on Oct. 3, 1997.

(51) Int. Cl.[7] .................................................. H03G 3/00

(52) U.S. Cl. .............................. 381/63; 381/61; 84/630

(58) Field of Search ....................... 381/61, 63; 84/630, 84/707, DIG. 26; 700/94

(56) References Cited

U.S. PATENT DOCUMENTS

| | | | |
|---|---|---|---|
| 5,467,401 A | * 11/1995 | Nagamitsu et al. | 381/63 |
| 5,525,765 A | * 6/1996 | Freiheit | 181/30 |
| 5,862,231 A | * 1/1999 | Tokuhisa | 381/61 |
| 5,876,213 A | * 3/1999 | Matsumoto | 84/610 |
| 5,880,390 A | * 3/1999 | Hagiwara | 84/630 |

FOREIGN PATENT DOCUMENTS

| | | | |
|---|---|---|---|
| JP | 05046193 | * 2/1993 | 381/63 |

OTHER PUBLICATIONS

Teller, Seth Jared "Visibility Computations in Densely Occluded Polyhedral Envoronments"; Dissertation, 1992, pp. 1–151.

Fuchs, Henry et al "On Visible Surface Generation by a Priori Tree Structures"; 1980, pp. 124–133.

Tsingos, Nicolas et al "Soundtracks for Computer Animation; Sound Rendering in Dynamic Environments with Occlusions"; 1997, pp. 9–16; p. 149.

Dadoun, Norm et al "The Geometry of Beam Tracing"; 1985, pp. 55–61.

Stephenson, Uwe et al "Pyramidal Beam Tracing and Time Dependent Radiosity"; Jun. 26–30, 1995; pp. 656–661.

Monks, Michael et al "Acoustic Simulation and Visualization Using a New Unified Beam Tracing and Image Source Approach"; pp. 1–8.

Heckbert, Paul S. et al "Beam Tracing Polygonal Objects"; Jul. 1984, vol. 18, no. 3, pp. 119–127.

* cited by examiner

*Primary Examiner*—Xu Mei

(57) ABSTRACT

A system and method for acoustic modeling partitions an input 3D spatial model into convex cells, and constructs a cell adjacency data structure representing the neighbor relationships between adjacent cells. For each sound source located in the spatial environment, convex pyramidal beams are traced through the input spatial model via recursive depth-first traversal of the cell-adjacency graph. During beam tracing, a beam tree data structure is constructed to encode propagation paths, which may include specular reflection, transmission, diffuse reflection, and diffraction events, from the source location to regions of the input spatial model. The beam tree data structure is then accessed for real-time computation and auralization of propagation paths to an arbitrary receiver location.

46 Claims, 16 Drawing Sheets

ACOUSTIC MODELING SYSTEM AND METHOD USING PRE-COMPUTED DATA STRUCTURES FOR BEAM TRACING AND PATH GENERATION

CROSS REFERENCE TO RELATED APPLICATION

This application claims priority under 35 U.S.C. §119(e) to U.S. Provisional application Serial No. 60/060,946 filed on Oct. 3, 1997.

BACKGROUND OF THE INVENTION

1. Field of the Invention

The present invention relates to a system and a method for modeling acoustic reverberation at interactive rates, using pre-computed data structures to accelerate beam tracing and propagation path generation.

2. Description of Prior Art

Computer-aided acoustic modeling is an important tool for designing and simulating three-dimensional (3D) environments. For example, an architect may evaluate the acoustic properties of a proposed building design, or a factory designer may predict the sound levels of any machine at any position on a factory floor, using acoustic models.

Acoustic modeling can also be used to provide a more realistic immersive virtual environment. For example, modeled acoustics may be used to provide sound cues to assist a user's navigation through, and communication in, immersive virtual environments. More specifically, the voices of users sharing a virtual environment may be spatialized according to the each user's avatar location. For 3D video games, sounds may be spatialized to help a player navigate and localize competing participants.

The primary challenge in spatializing sound in such environments is computing the significant number of viable propagation paths from a sound source position to a listener's receiving location. Because sound generally travels between a source and a receiver along a large number of paths, via reflection, transmission, and diffraction, accurate acoustic simulation is extremely computationally expensive. To illustrate this point, consider the example of FIG. 1 which shows a simple two-room environment, and just some of the possible propagation paths from a sound source S to a receiver R located in an adjacent room.

Prior acoustic modeling approaches can generally be classified into four types: image source methods; radiant exchange methods; ray tracing methods; and beam tracing. Beam tracing is the basis for the approach set forth in this application.

Beam tracing methods classify reflection paths originating from a source position by recursively tracing pyramidal beams (i.e., a set of rays) through space. More specifically, a set of pyramidal beams is constructed that completely covers the two-dimensional (2D) space of directions from the source. For each beam, polygons are considered for intersection in front-to-back order from the source. As intersecting polygons are detected, the original beam is "clipped" to remove the shadow region created by the intersecting polygon, a transmission beam is constructed matching the shadow region, and a reflection beam is constructed by mirroring the transmission beam over the intersecting polygon's plane. For example, as illustrated in FIG. 2, a reflection beam $R_a$ is constructed by mirroring a transmission beam over surface a, using S' as a virtual beam source. Transmission beam $T_a$ is constructed matching the shadow region created by surface a.

A significant advantage of beam tracing over the image source method is that fewer virtual sources need be considered for environments with arbitrary geometry. Since each beam represents the region of space for which a corresponding virtual source (at the apex of the beam) is visible, high-order virtual sources must be considered only for reflections off polygons intersecting the beam. For instance, referring to FIG. 3, consider the virtual source $S_a$ which results from the reflection of the beam originating from S over polygon a. The corresponding reflection beam, $R_a$, intersects exactly the set of polygons (c and d) for which second-order reflections are possible after specular reflection off polygon a. Other polygons (b, e, f, and g) need not be considered for second-order reflections after a, thus significantly pruning the recursion tree of virtual sources.

A significant disadvantage of conventional beam tracing techniques, however, is that the geometric operations which are required to trace a beam through a 3D environment (i.e., computing intersections, clipping, and mirroring) are computationally expensive. Because each beam may be reflected and/or obstructed by several surfaces, particularly in complex environments, it is difficult to perform the necessary geometric operations on beams efficiently, as they are recursively traced through the spatial environment. For acoustic modeling to be effective in immersive virtual environments, computations must be completed at interactive rates so that spatialized audio output can be updated as the user navigates through the environment.

Much prior work in virtual environment systems has focused on visualization (i.e., methods for rendering more realistic images or for increasing image refresh rates). For example, Heckbert and Hanrahan, "Beam Tracing Polygonal Objects," *Computer Graphics* (SIGGRAPH '84), 18, 3, 119–127 describe a graphics illumination technique in which pyramidal beams, represented by their 2D polygonal cross-sections, are traced recursively from a viewpoint to a point light source using a pre-computed "light beam tree" data structure. Teller, "Visibility Computations in Densely Occluded Polyhedral Environments," Ph.D. thesis, Computer Science Division (EECS), University of California, Berkeley, 1992, describes a beam tracing algorithm for computing a "potentially visible set" of polygons to render from a particular viewpoint in a computer graphics scene using cell adjacency and "stab tree" data structures.

On the other hand, relatively little attention has been directed to auralization (i.e., rendering realistic spatialized sound using acoustical modeling). Yet, improved acoustic modeling can help provide users with a completely immersive virtual experience, in which aural and visual cues are combined to support a more natural interaction in a virtual environment. Due to the computational complexity discussed above, however, prior acoustic modeling techniques, such as conventional beam tracing, have been unable to realize accurate acoustic auralization in complex environments at interactive rates. Furthermore, such techniques have essentially disregarded complex scattering phenomena, such as diffraction and diffuse reflection.

SUMMARY OF THE INVENTION

The acoustic modeling technique according to the present invention efficiently utilizes a combination of pre-computed data structures to accelerate evaluation of acoustic propagation paths so that sound can be modeled and auralized in real-time, even in complex environments. According to the present invention, an input spatial model is initially partitioned into convex polyhedra (cells). Pairs of neighboring cells which share a polygonal boundary(s) are linked to form a cell adjacency graph. For each sound source, convex pyramidal beams are traced through the spatial model via depth-first recursive traversal of the cell adjacency graph. At each cell boundary, the beam is split and trimmed into possibly several convex beams representing paths of transmission, specular reflection, diffuse reflection, and diffraction.

During depth-first traversal of the cell adjacency graph, a beam tree data structure is generated to represent the regions of space reached by each potential sequence of transmission, specular reflection, diffuse reflection, and diffraction events at cell boundaries. This beam tree data structure enables fast computation of propagation paths to an arbitrary receiver position. Using the beam tree data structure to trace paths from a source to a receiver, acceptable computation rates for updating an acoustic model can be achieved so as to be suitable for interactive environments.

BRIEF DESCRIPTION OF THE DRAWINGS

FIG. 5(*b*) illustrates a spatial. subdivision of the input model of FIG. 5(*a*);

FIG. 10(*b*) is a flowchart further illustrating the beam tracing algorithm of the present invention;

FIG. 10(*c*) is a flowchart further illustrating the beam tracing algorithm of the present invention;

FIG. 10(*d*) is a flowchart further illustrating the beam tracing algorithm according to the present invention;

DETAILED DESCRIPTION OF THE PREFERRED EMBODIMENTS

The following detailed description relates to an acoustic modeling system and method which utilizes pre-computed data structures to accelerate tracing and evaluating acoustic propagation paths, thus enabling accurate acoustic modeling at interactive rates.

System Overview

Figure 1:
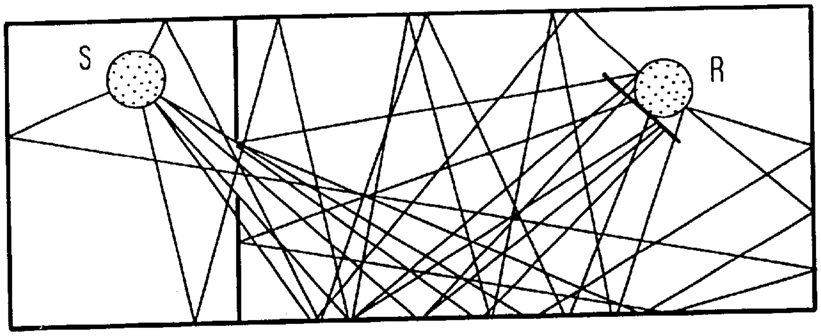
FIG. 1 illustrates several propagation paths between a sound source and a receiver location in a simple spatial model.
Figure 2:
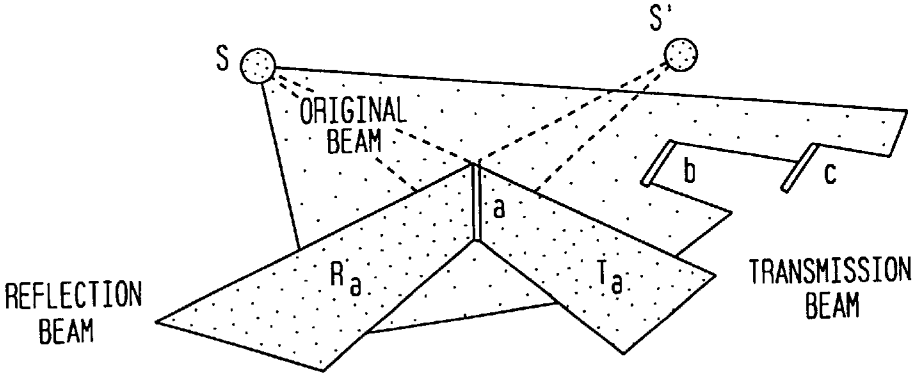
FIG. 2 illustrates a conventional beam tracing method.
Figure 3:
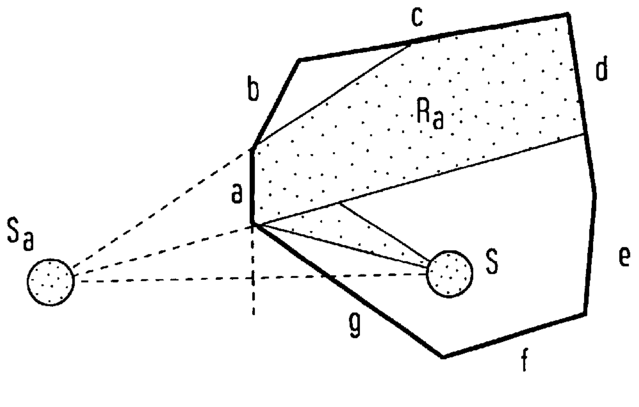
FIG. 3 illustrates conventional beam tracing using a virtual source to construct a specular reflection beam.
Figure 4:
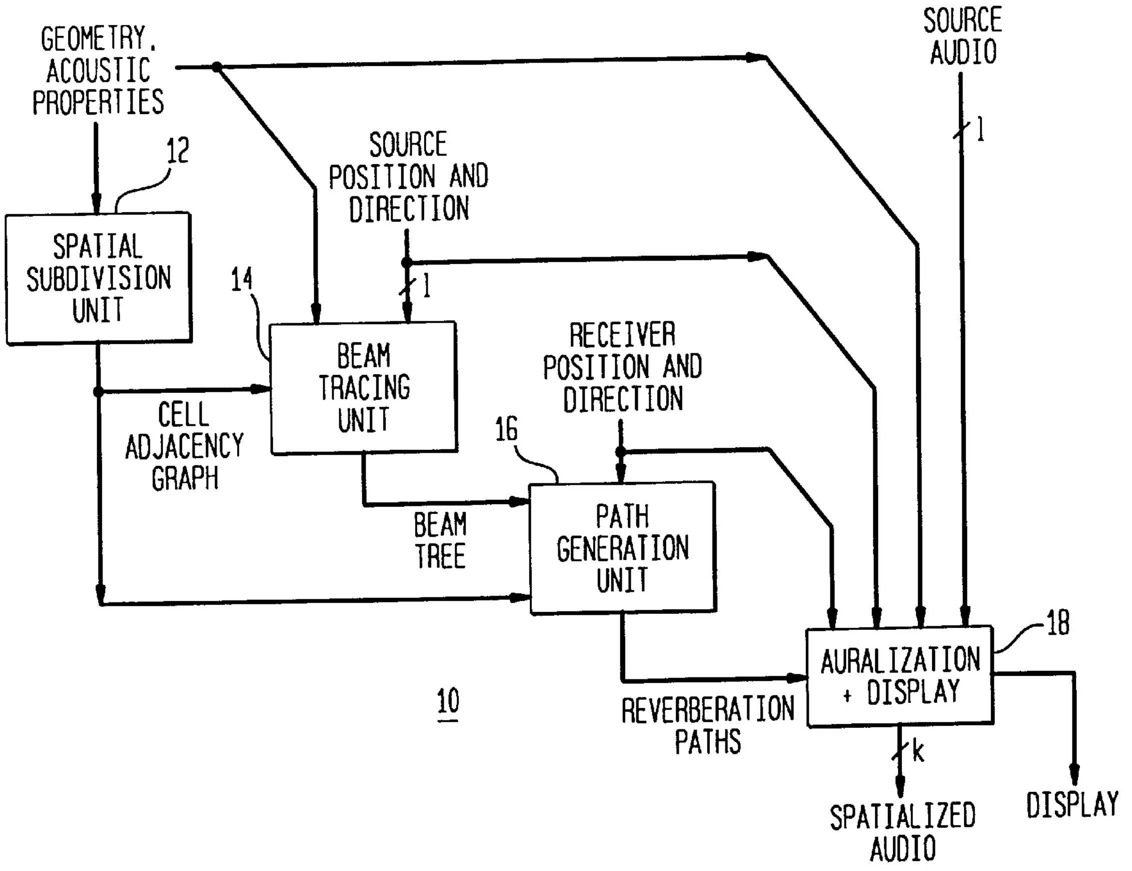
FIG. 4 is an overview of the acoustic modeling system according to the present invention.

FIG. 4 illustrates an overview of the acoustic modeling system 10 according to the present invention. Since the acoustic modeling approach described herein is discussed with reference to four distinct phases (spatial subdivision, beam tracing, path generation, and auralization/display), the modeling system 10 is shown, for ease of explanation, as a combination of four discrete processing elements: a spatial subdivision unit 12; a beam tracing unit 14; a path generation unit 16; and an auralization and display unit 18. It should be understood, however, that these illustrated discrete elements may be realized as a single processor or a combination of processors.

The general function of the acoustic modeling system 10 is to take as input: 1) a description of the geometric and acoustic properties of the surfaces in the environment (i.e., a set of polygons with associated acoustic properties), and 2) one or more audio source signals at fixed locations, and, as a user interactively moves through the virtual environment, generate multi-channel audio signal(s) spatialized according to the computed propagation paths from each audio source to the observer location.

As will be discussed in greater detail below, the spatial subdivision unit 12 pre-computes the spatial relationships which are inherent in a set of polygons describing a 3D spatial environment. The spatial subdivision unit 12 represents these inherent spatial relationships in a data structure called a cell adjacency graph, which facilitates subsequent beam tracing.

Next, the beam tracing unit 14 recursively follows paths of specular reflection and transmission, as well as diffraction and diffuse reflection, through the spatial environment via depth-first traversal of the cell adjacency graph computed by the spatial subdivision unit 12. While recursively tracing acoustic beam paths through the spatial environment, the beam tracing unit 14 creates a beam tree data structure which explicitly encodes the spatial regions reached by particular acoustic beam paths (i.,e., as sequence of specular reflection, transmission, diffraction, and diffuse reflection events) from each source point.

When a user interactively inputs a receiver location, the path generation unit 16 computes propagation paths from each source point to the receiver location via lookup in the pre-computed beam tree data structure. Furthermore, as the user moves the receiver location, the path generation unit 16 computes updated propagation paths in real-time using the pre-computed beam tree data structure.

Finally, the auralization and display unit 18 computes one or more source-receiver impulse responses, which each represent the filter response (e.g., time delay and attenuation) created along viable propagation paths from the source point to the receiver. The auralization and display unit 18 convolves each source-receiver impulse response with the corresponding source audio signal, and outputs the resulting signal(s) to the user so that accurately modeled audio signals are continuously updated as the user interactively navigates through the virtual environment. The spatialized audio output may be synchronized with real-time graphics output to provide an immersive virtual environment experience. Furthermore, for acoustic design applications, the auralization and display unit 18 may output a graphic representation of propagation paths between the source and receiver to a display.

Spatial Subdivision

As illustrated in FIG. 4, the spatial subdivision unit 12 receives data which geometrically defines the relevant environment (e.g., a series of connected rooms or a building) and acoustic surface properties (e.g., the absorption characteristics of walls and windows). Although the model shown in FIG. 5(*a) is in* 2D for ease of illustration, the line segments labeled a–q actually represent planar surfaces in 3D, such as walls, and thus are referred to as "polygons" herein to make it clear that the disclosed acoustic modeling approach is applicable to 3D environments.

Figure 5A:
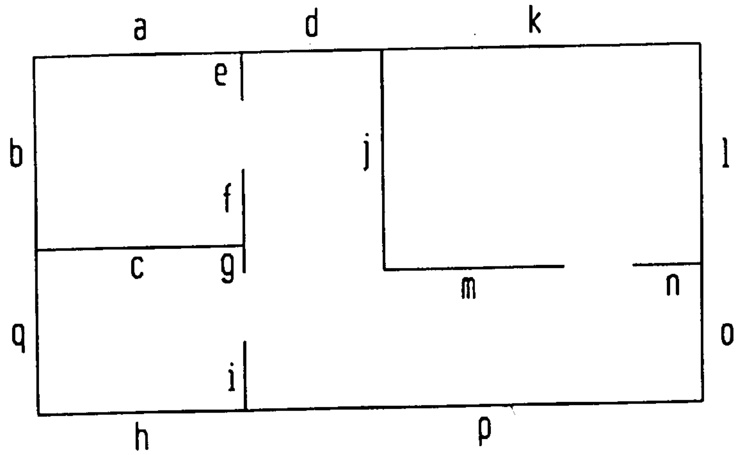
FIG. 5(*a*) illustrates an input spatial model used to demonstrate the acoustic modeling technique of the present invention.
Figure 5B:
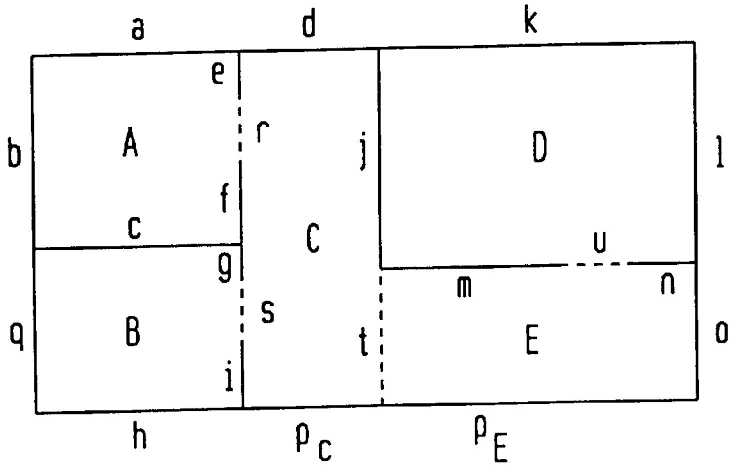

As mentioned above, the spatial subdivision unit 12 pre-processes the input geometric data to construct a spatial subdivision of the input model, and ultimately generates a cell adjacency graph representing the neighbor relationships between regions of the spatial subdivision. Initially, the spatial subdivision is constructed by partitioning the input model into a set of convex polyhedral regions (cells). FIG. 5(*b*) illustrates such a spatial subdivision computed for the input model shown in FIG. 5(*a*).

The spatial subdivision unit 12 builds the spatial subdivision using a Binary Space Partition (BSP) process. As is well known, BSP is a recursive binary split of 3D space into convex polyhedral regions (cells) separated by planes. (Fuchs et al., "On Visible Surface Generation by a Priori Tree Structures," *Computer Graphics*, Proc. SIGGRAPH '80, 124–133). The spatial subdivision unit 12 performs BSP by recursively splitting cells along selected candidate planes until no input polygon intersects the interior of any BSP cell. The result is a set of convex polyhedral cells whose convex, planar boundaries contain all the input polygons.

FIG. 5(*b*) illustrates a simple 2D spatial subdivision for the input model of FIG. 5(*a*). Input polygons appear as solid line segments labeled with lower-case letters a–q; transparent cell boundaries introduced by the BSP are shown as dashed line segments labeled with lower-case letters r–u; and constructed cell regions are labeled with upper-case letters A–E. As seen in FIG. 5(*b*), a first cell, A, is bound by polygons a, b, c, e, f, and transparent boundary polygon r (e.g, a doorway); a second cell, B, is bound by polygons c, g, h, i, q, and transparent boundary polygon s; a third cell, C, is bound by polygons d, e, f, g, i, j, $p_c$, and transparent boundary polygons r, s, t; a fourth cell, D, is bound by polygons j, k, l, m, n, and transparent boundary polygon u; and a fifth cell, E, is bound by polygons m, n, o, $p_e$ and transparent boundary polygons u and t.

The spatial subdivision unit 12 next constructs a cell adjacency graph to explicitly represent the neighbor relationships between cells of the spatial subdivision. Each cell of the BSP is represented by a node in the graph, and two nodes have a link between them for each planar, polygonal boundary shared by the corresponding adjacent cells in the spatial subdivision.

Figure 6:
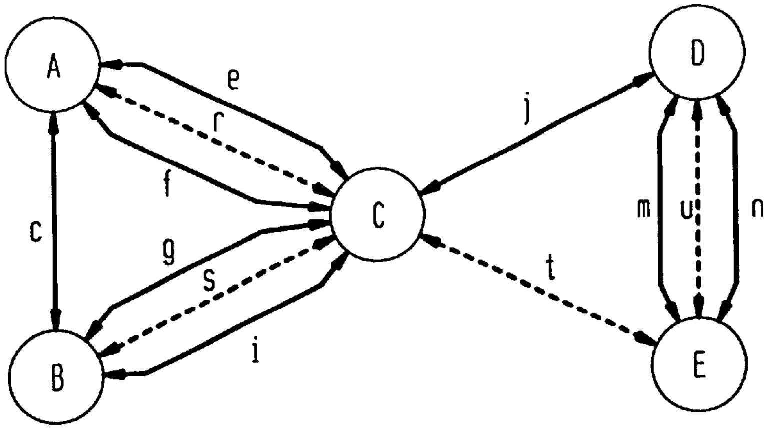
FIG. 6 illustrates a cell adjacency graph constructed for the spatial subdivision shown in FIG. 5(*b*)

As shown in FIG. 5(*b*), cell A neighbors cell B along polygon c, and further neighbors cell C along polygons e, f, and transparent polygon r. Cell B neighbors cell C along polygons g, i, and transparent polygon s. Cell C neighbors cell D along polygon j, and further neighbors cell E along transparent boundary polygon t. Cell D neighbors cell E along polygons m, n, and transparent polygon u. This neighbor relationship between cells A–E is stored in the form of the cell adjacency graph shown in FIG. 6, in which a solid line connecting two cell nodes represents a shared polygon, while a dashed line connecting two cell nodes represents a shared transparent boundary polygon.

Construction of the cell adjacency graph may be integrated with the BSP algorithm. In other words, when a region in the BSP is split into two regions, new nodes in the cell adjacency graph are created corresponding to the new cells, and links are updated to reflect new adjacencies. A separate link is created between two cells for each convex polygonal region that is entirely either transparent or opaque.

Beam Tracing

The beam tracing algorithm according to the present invention recursively follows paths of specular reflection, transmission, diffraction, and diffuse reflection originating from an audio source point, and generates a beam tree data structure encoding these paths. The beam tracing unit 14 accelerates this recursive process by accessing the cell adjacency graph generated by the spatial subdivision unit 12, and using the relationships encoded in the cell adjacency graph to accelerate acoustic beam tracing through the spatial subdivision.

The beam tracing method according to the present invention will be described with reference to the beam path examples shown in FIG. 7 (transmission and specular reflection only), FIG. 8 (including diffraction paths), and FIG. 9 (including diffuse reflection), the flowcharts shown in FIGS. 10(*a*)–10(*d*), and the partial beam trees shown in FIGS. 11 and 12. More specifically, the beam tracing unit 14 traces transmission and specular reflection as described above and further traces beams that enclose the regions of space reached by diffracting and diffuse reflection paths, and nodes are created in the beam tree data structure representing transmission, specular reflection, diffraction, and diffuse reflection events at cell boundaries.

For diffuse reflection and diffraction, the geometry of the beams is most useful for computing candidate propagation paths, while the amplitude of the signal along any of these paths can be evaluated for a known receiver during path generation so that insignificant paths may be disregarded. The following discussion details how diffraction and diffuse reflection are modeled with reference to FIGS. 8 and 9.

Figure 8:
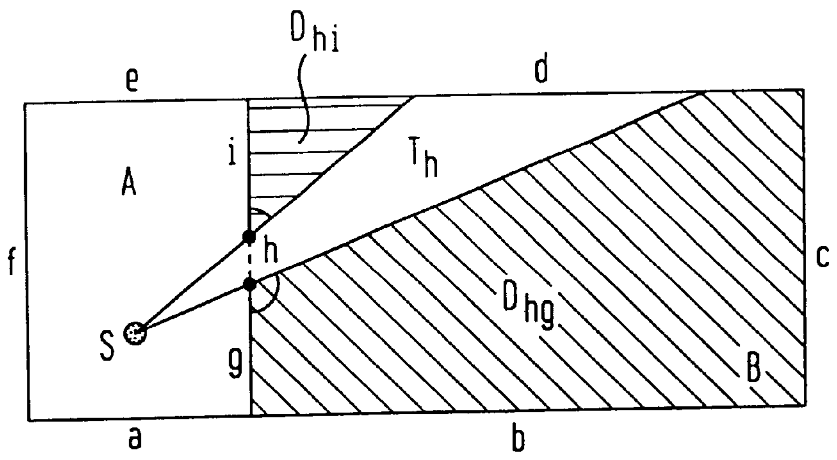
FIG. 8 illustrates an example of a diffraction path modeled in accordance with the present invention.

FIG. 8 illustrates a diffraction path modeled in accordance with the present invention. According to the Geometrical Theory of Diffraction, an acoustic field that is incident on a discontinuity along a boundary edge has a diffracted wave that propagates into the shadow region created by the boundary. Such a diffracted wave is modeled in geometric terms by considering the edge to be a source of new waves emanating from the edge. Higher order reflections and diffractions then occur as diffracted waves impinge on other surfaces and edge discontinuities. By using edge-based adjacency information in the spatial subdivision data structure, the geometric operations required to construct and trace beams along paths of diffraction can be quickly performed.

For a given beam, edges which cause diffraction, are those that intersect with the beam, and are shared by cell boundaries with different acoustic properties (e.g., one cell boundary is transparent and another cell boundary is opaque). For each such edge, the region of space reached by the wave is extended by diffraction at the portion of the edge which intersects the impinging beam, to the entire region from which the edge is visible. The effect of the diffraction is most prominent in the shadow region of the edge. For densely-occluded environments, the modifications due to diffraction can be computed and traced in expected-case constant time.

For the example shown in FIG. 8, the transmitted beam h intersects a first discontinuity at the junction of polygon g and transparent polygon h, and a second discontinuity at the intersection of polygon i and transparent polygon h, thus creating diffracted waves that propagate to the entire region visible from the edge separating the polygons g and h and the edge separating polygons h and i. These diffracted waves are modeled by considering each edge as a new source of waves. Thus the region reached by the wave is extended into the regions Dhg and Dhi illustrated in FIG. 8.

Figure 9:
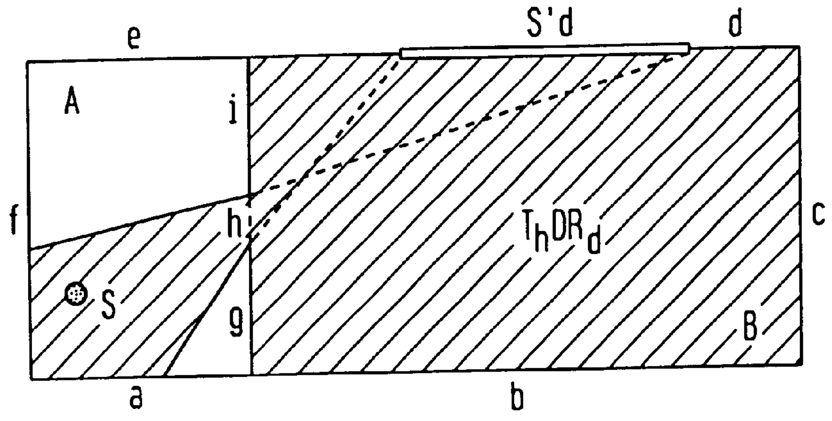
FIG. 9 illustrates an example of a diffuse reflection path modeled in accordance with the present invention.
Figure 10A:
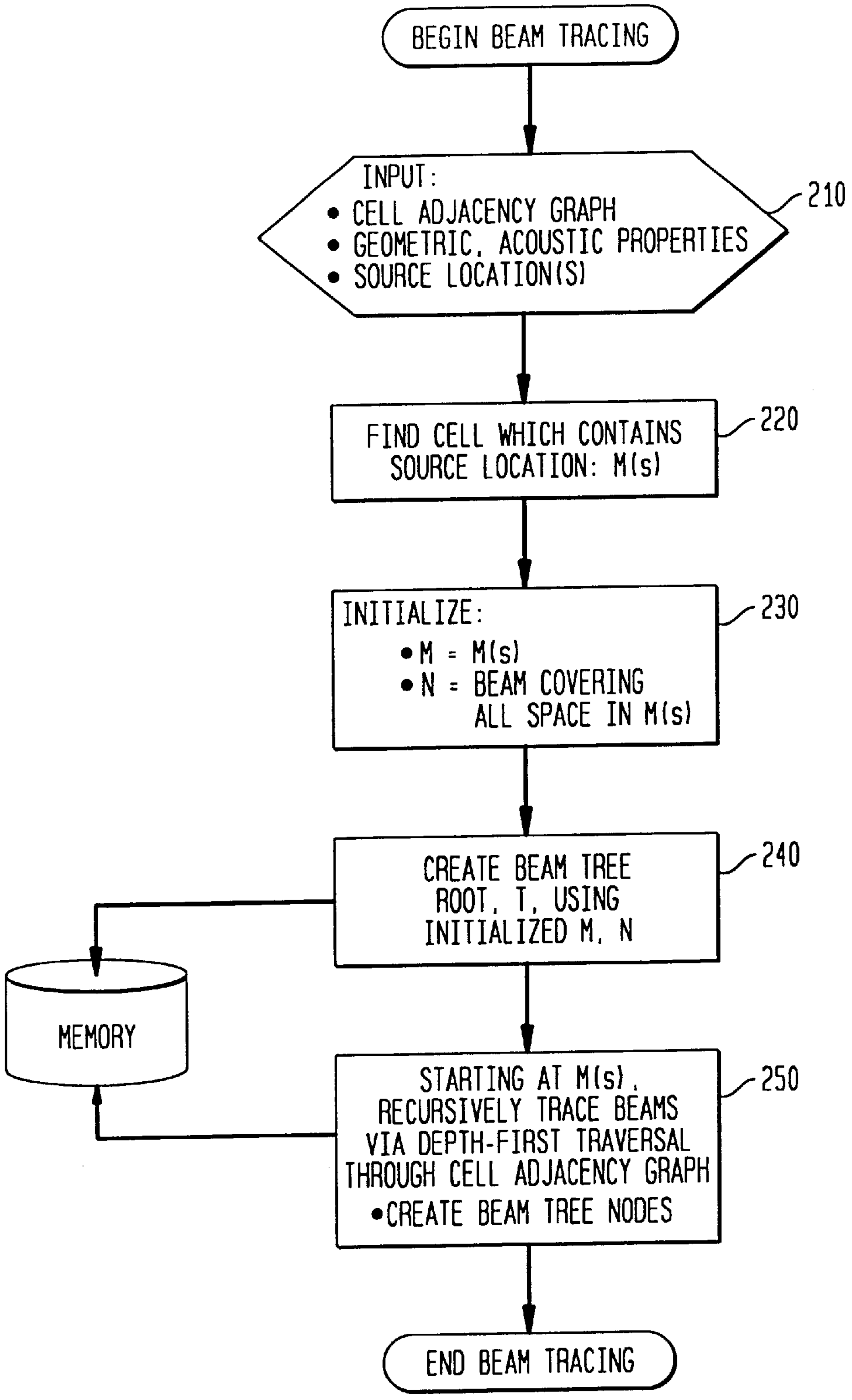
FIG. 10(*a*) is a high-level flowchart for the beam tracing algorithm of the present invention.
Figure 10B:
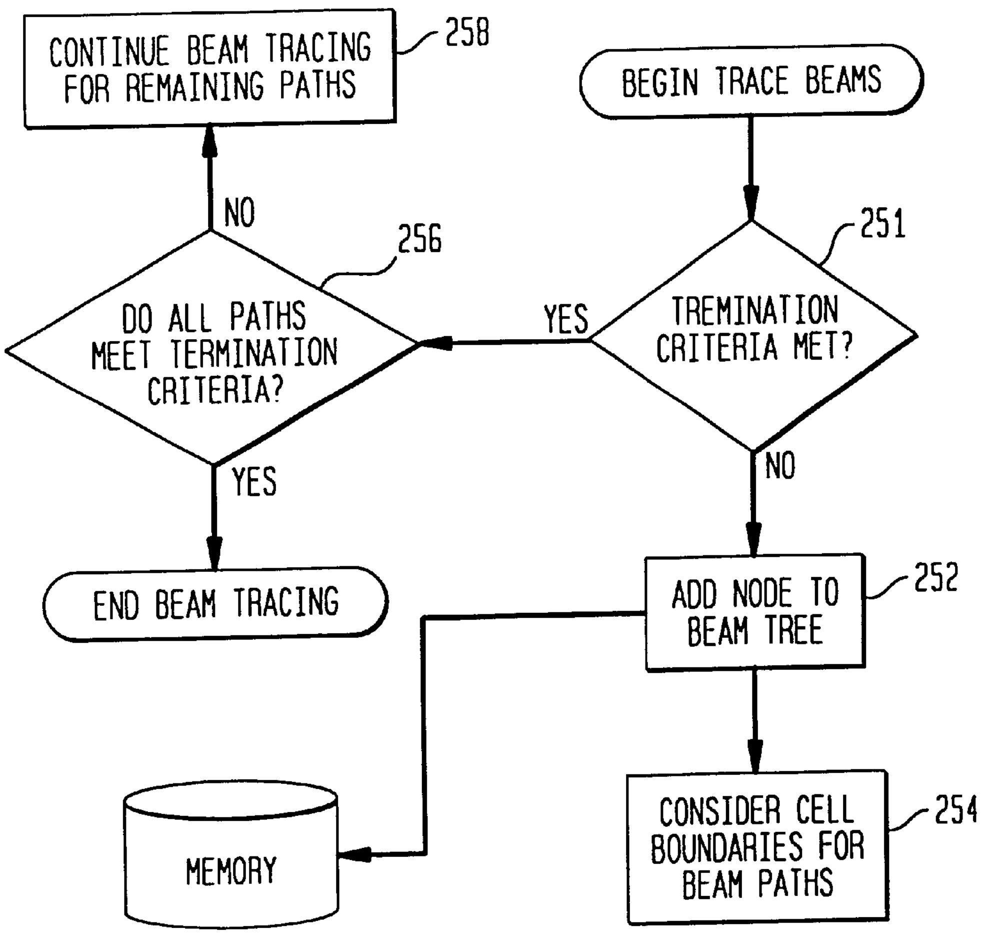
Figure 10C:
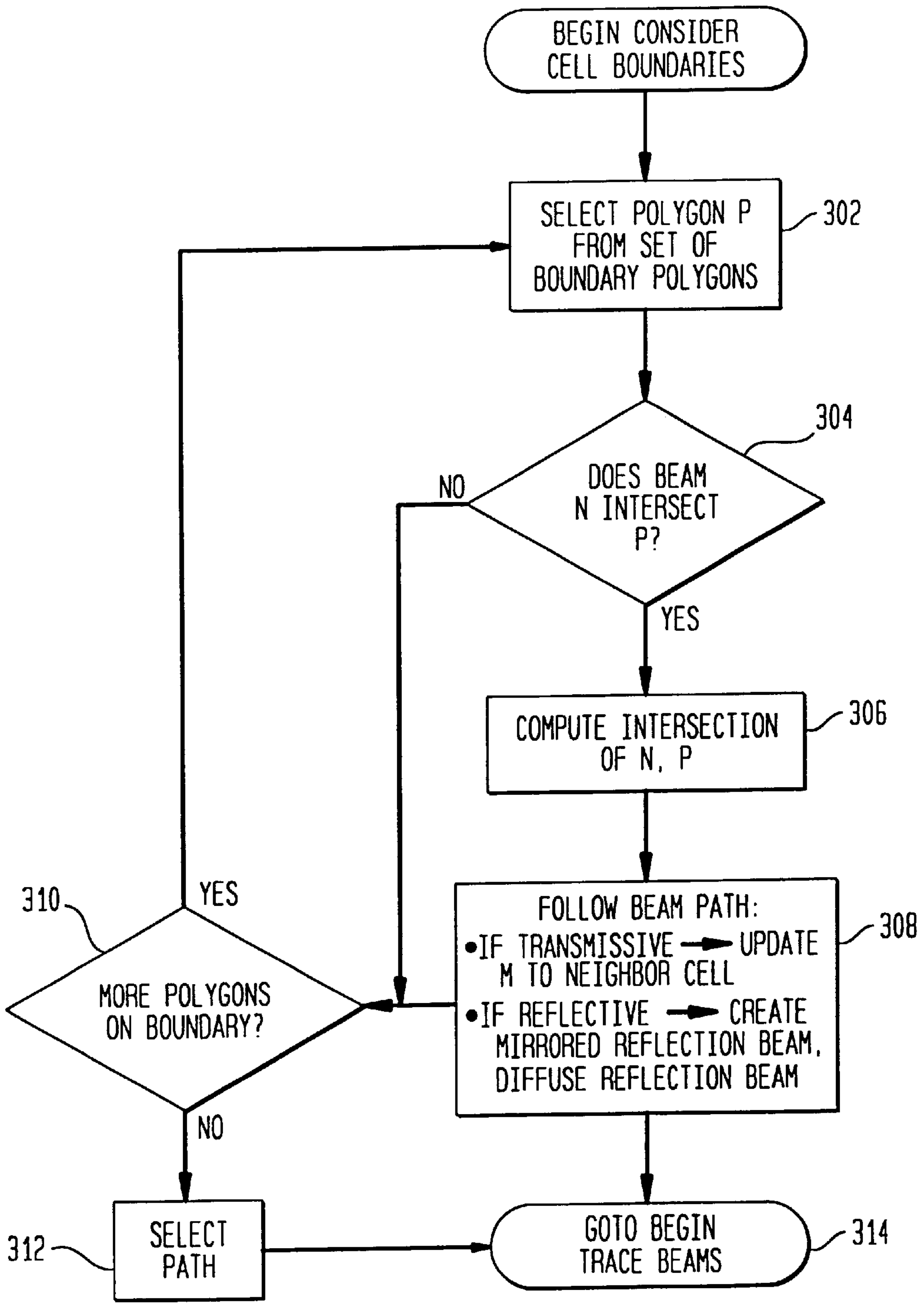
Figure 10D:
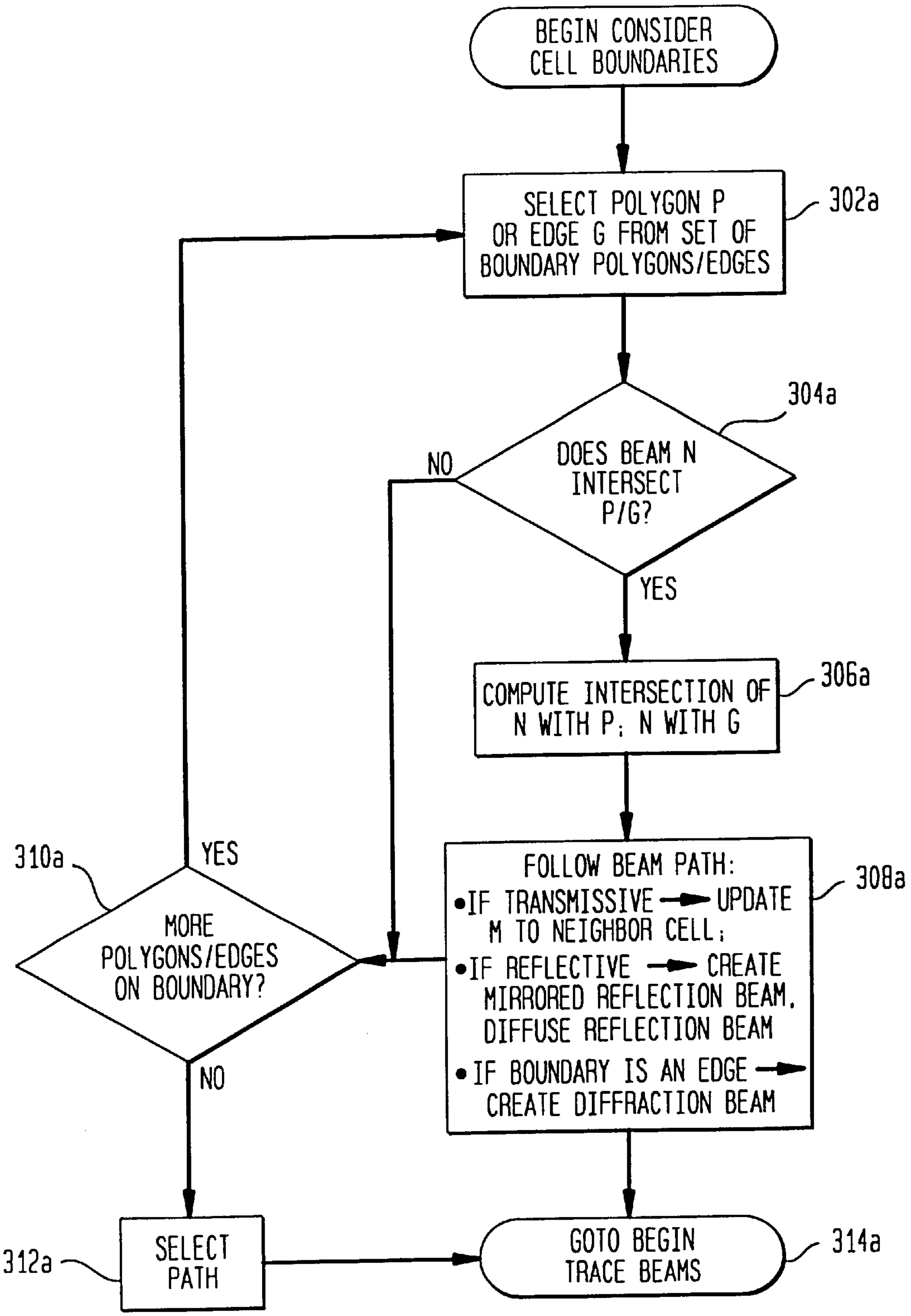

FIG. 9 illustrates a modeled diffuse reflection beam in accordance with the present invention. The present algorithm may model reflections and diffractions from some highly faceted surfaces as diffuse reflections emanating equally in all directions from planar surfaces. To compute the region of space reached by a diffuse reflection event using the present approach, the beam tracing unit 14 constructs a beam whose "source" is the convex polygonal region of the surface intersected by an impinging beam, and whose initial extent encloses the entire half-space in front of that "source." The beam tracing unit 14 traces the beam through the cell adjacency graph to find the region of space reached from any point on the reflecting part of the surface (i.e., the anti-penumbra).

For the 2D model illustrated in FIG. 9, when the transmission beam $T_h$ impinges on polygon d, the portion of polygon d which intersects $T_h$ is used as a "source" of diffuse reflection. As seen in FIG. 9, this new source $S_d'$ creates a diffuse reflection beam $T_hDR_d$ which reaches the entire space of cell B, and also transmits through, and is "clipped" as it passes through transparent boundary polygon h to cell A. Having described how diffraction and diffuse reflection events are modeled, the operation of the beam tracing unit 14 for encoding paths of specular reflection, diffuse reflection, transmission, and diffraction is next discussed with reference to the flow charts of FIGS. 10(*a*)–10(*d*).

The beam tracing unit 14 traces beam paths through the input spatial subdivision via a recursive, depth-first traversal of the cell adjacency graph, starting in the cell containing a source point. The beam tracing unit 14 first accesses the cell adjacency graph generated by the spatial subdivision unit 12, the geometric and acoustic properties of the input spatial model, and the position of a source point S, at step 210.

At step 220, the beam tracing unit 14 searches the spatial subdivision of the input model to find the cell, M(S), which contains source point S. Throughout the recursive, depth-first traversal of the cell adjacency graph, the algorithm maintains a current cell M, (as a reference to a cell in the spatial subdivision) and a current beam N (an infinite convex pyramidal beam whose apex is the actual source point or a virtual source point). At step 230, current cell M is initialized as M(S), and current beam N is initialized as the beam covering all space in M(S).

As discussed above, the goal of the beam tracing unit 14 is to generate a beam tree data structure which encodes the regions of space reachable by a sequence of propagation events originating from an audio source location. The beam tree unit 14 creates the root of the beam tree at step 240 using the initialized values of current cell M and current beam N, and stores the beam tree root data in memory.

Next, at step 250, the beam tracing unit 14 recursively traces beams, starting in the cell M(S). Adjacent cells are visited recursively while a beam representing the region of space reachable from the source by a sequence of specular reflection, diffuse reflection, transmission, and diffraction, events is incrementally updated. As the algorithm traverses a cell boundary into a new cell, the current convex pyramidal beam is "clipped" to include only the region of space passing through the polygonal boundary.

When a boundary polygon P is a transmissive surface, the algorithm follows a transmission path to the cell which neighbors the current cell M across P with a transmission beam constructed as the intersection of current beam N with a pyramidal beam whose apex is the source point (or a virtual source point), and whose sides pass through the edges of P. Likewise, when P is a reflecting input surface, the algorithm follows a specular reflection path within current cell M with a specular reflection beam, constructed by mirroring the transmission beam over the plane supporting P. Furthermore, a diffuse reflection path is followed when P is a diffusely reflecting polygon, and a diffraction path is followed for boundary edges which intersect current beam N in a manner discussed above.

The depth-first traversal along any path terminates, for example, when the length of the path exceeds a predetermined or user-specified threshold, or when the cumulative absorption due to transmission and reflection events exceeds a threshold. The traversal may also terminate when the total number of reflections and/or transmissions exceeds a third threshold.

While tracing beams through the spatial subdivision, the algorithm constructs a beam tree data structure corresponding directly to the recursion tree generated during depth-first traversal of the cell adjacency graph. Each node of the beam tree stores: 1) a reference to the cell being traversed, 2) the cell boundary most recently traversed (if there is one), and 3) the sequence of reflection, transmission, and diffraction events along the current path of the depth-first traversal. To further accelerate subsequent propagation path generation, each cell of the spatial subdivision stores a list of "back-pointers" to its beam tree ancestors.

The basic steps of this recursive beam tracing and node creating routine (referred to herein as the "Trace Beams" routine) are illustrated in FIG. 10(*b*). At step 251, the algorithm determines whether the current path being traced should terminate due to, for example, excessive path length or absorption. If no termination occurs, the beam tracing unit 14 creates a beam tree node at step 252, storing in memory the beam path data discussed above. When the algorithm determines at step 251 that the current path should terminate, the algorithm decides at step 256 whether there are remaining paths which have not been terminated, and if so proceeds at step 258 to continue the recursive tracing until all paths terminate.

Following step 252, the Trace Beams routine proceeds to step 254 and checks which boundary polygons/edges of current cell M intersect with current beam N. More specifically, a subroutine (referred to herein as the "Consider Cell Boundaries" subroutine) is initiated having the steps shown in the flowchart of FIG. 10(*c*). For considering boundary polygons for specular reflection, diffuse reflection, and transmission paths, this subroutine selects a first polygon P of the set of polygons at step 302 which form a boundary around current cell M, and determines at step 304 whether current beam N intersects the selected polygon P. If not, the subroutine determines at step 310 whether all boundary polygons of current cell M have been checked for intersection with current beam N, and if not returns to step 302 to select another boundary polygon. When a selected polygon P intersects current beam N, the beam tracing unit 14 computes the intersection at step 306, and follows the path(s) (i.e., transmission, specular reflection, and diffuse reflection paths) created when the current beam N impinges on the polygon P at step 308. When the intersecting polygon P is transmissive, the subroutine recurses to the cell adjacent to current cell M with a transmission beam.

Likewise, when polygon P is a reflecting input surface, a specular reflection beam is created by constructing a mirror of the transmission beam over the plane supporting polygon p, and a diffuse reflection beam is created using the computed intersection region as a new wave "source" as discussed above with reference to FIG. 9.

After all possible transmission beams and reflection beams for the boundary polygons of current cell M have been computed, a candidate path is selected at step 312, and the subroutine returns to the start of the Trace Beams routine. This recursive, depth-first traversal continues until the algorithm determines at step 256 that all paths terminate, signifying that the beam tree data structure for a particular source point in the spatial subdivision is complete.

To account for diffraction events in the beam tracing method discussed above, the Consider Cell Boundaries subroutine of FIG. 10(*c*) can be modified, as illustrated in FIG. 10(*d*), so that edges are considered in addition to boundary polygons.

Specifically, the Consider Cell Boundaries subroutine illustrated in FIG. 10(*d*) selects either a boundary polygon P or an edge G from the set of polygons and edges which form a boundary around current cell M, and determines at step 304a whether current beam N intersects with the selected polygon/edge. If not, the subroutine determines at step 310a whether all boundary polygons/edges of current cell M have been checked for intersection with current beam N, and if not returns to step 302*a* to select another boundary polygon or edge. For the case when an edge G is selected at step 302*a* which intersects with current beam N, the intersection of current beam N and G is computed at step 306*a*, and a diffraction propagation path is created at step 308*a*.

Figure 7:
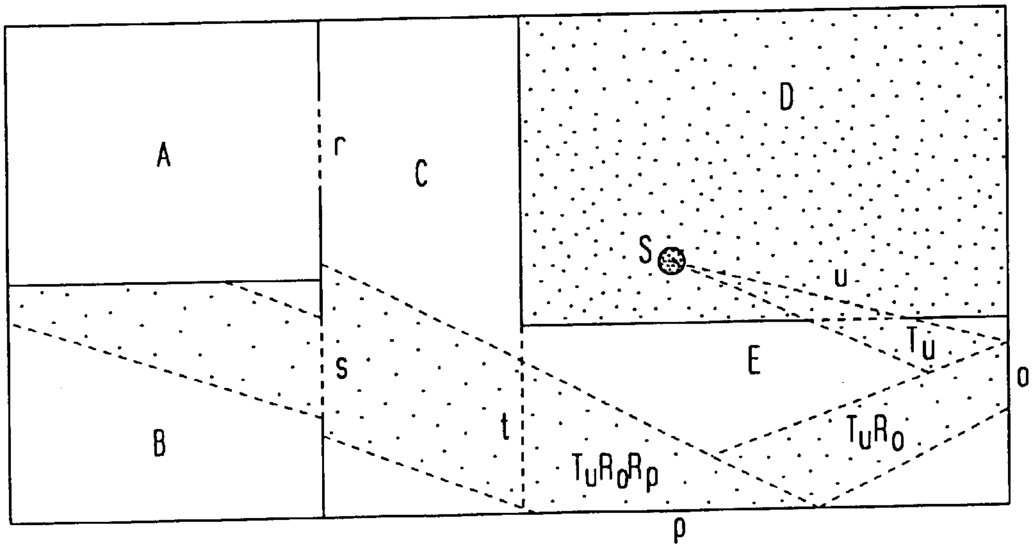
FIG. 7 illustrates specular reflection and transmission beams traced from a source location in the input model of FIG. 5(*a*)

FIG. 7 illustrates a beam tracing example for a series of specular reflection and transmission events through the simple 2D model illustrated in FIG. 5(*a*). The depth-first traversal starts in cell D, which contains source point S, with a beam covering the entire cell space of D. Beams are created and traced for each of the six boundary polygons of cell D (i.e., j, k, l, m, n, and u). For example, transmission through the transparent boundary u results in a beam $T_u$ that is trimmed as it enters cell E through the transparent boundary u. $T_u$ intersects only polygon o as it passes through cell E, which results in a reflection beam $T_uR_o$. Reflecting beam $T_uR_o$ intersects only polygon P, which spawns a reflection beam $T_uR_oR_p$.

Figure 11:
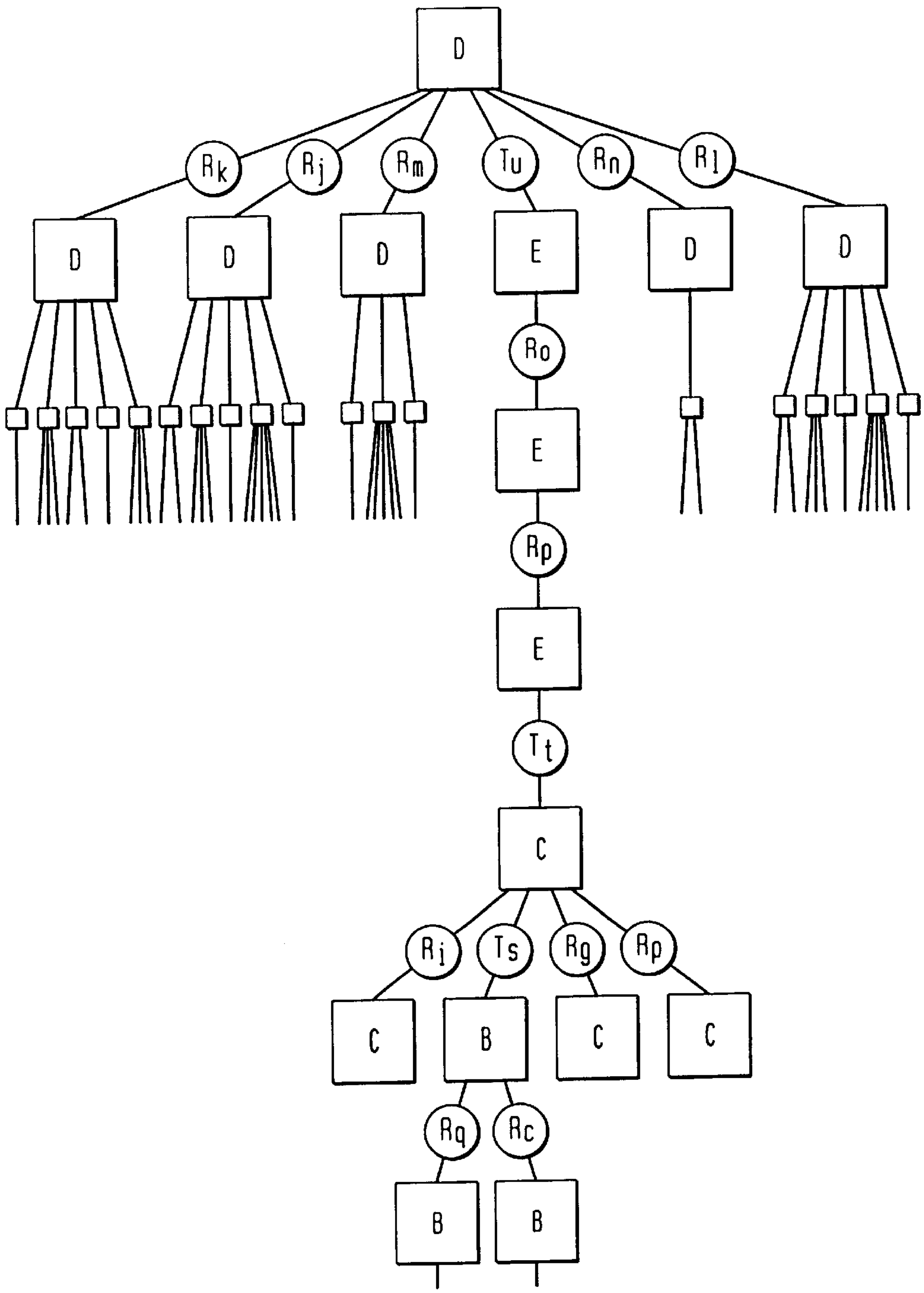
FIG. 11 illustrates a partial beam tree encoding paths of specular reflection and transmission constructed during beam tracing in accordance with the present invention.

FIG. 11 shows a partial beam tree corresponding to the traversal of FIG. 7. For this beam tree example, it is assumed that each of the boundary polygons j, k, l, m, and n of cell D are reflective, but not transmissive. Each of these boundary polygons thus spawn a reflective beam (not shown is FIG. 7) which remains in cell D. These reflection beams, $R_k$, $R_j$, $R_m$, $R_n$, and $R_l$ are encoded in the beam tree structure shown in FIG. 11. As discussed above, the transmission beam $T_u$ through the cell boundary u spawns a series of specular reflection and transmission events which are represented in the beam tree.

Figure 12:
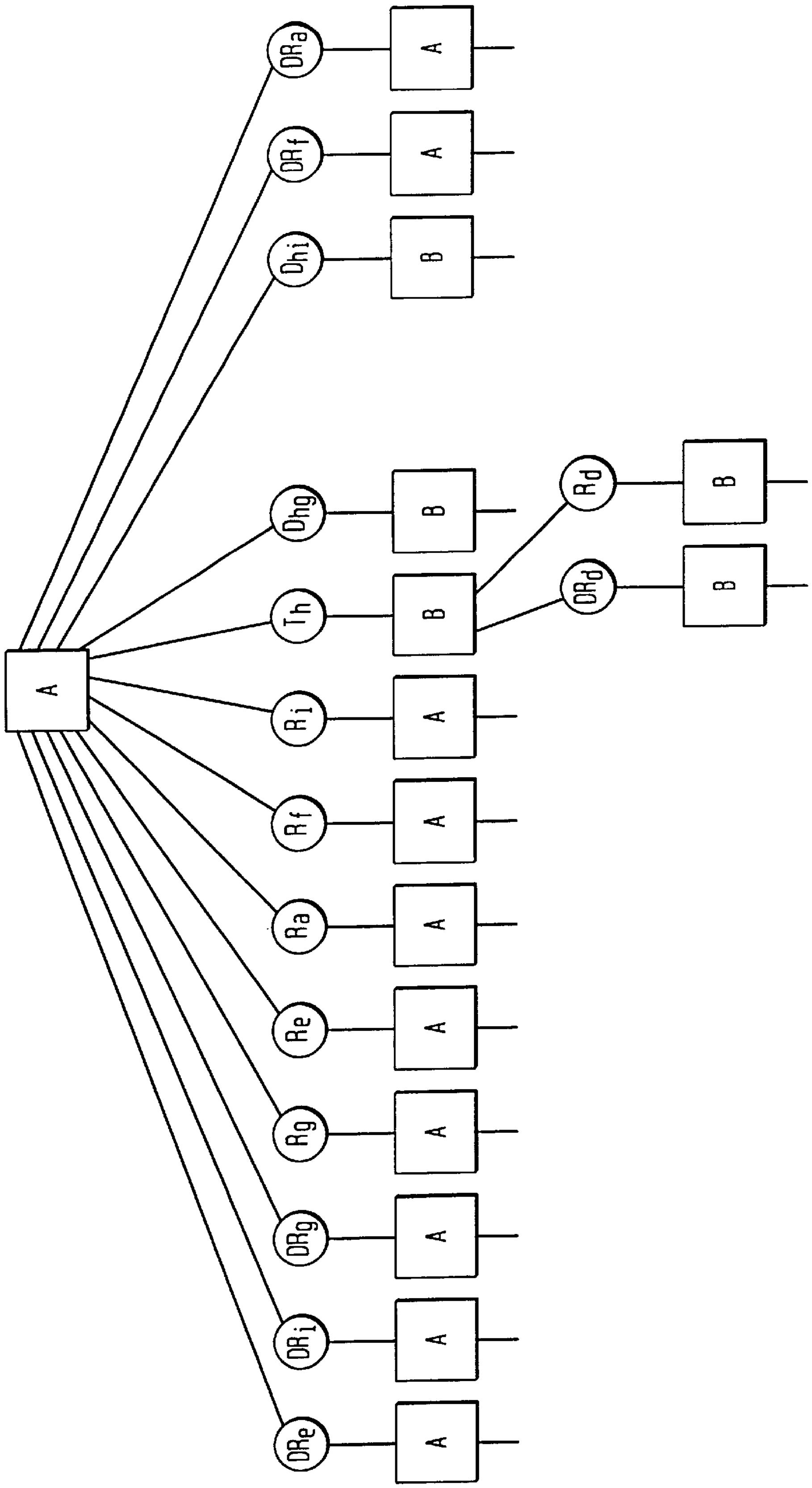
FIG. 12 illustrates a partial beam tree encoding paths of specular reflection, transmission, diffraction, and diffuse reflection.

FIG. 12 illustrates a partial beam tree corresponding to the beam tracing examples shown in FIGS. 8 and 9. For this beam tree example, it is assumed that each of the boundary polygons a, e , f, i, and g of cell A are reflective but not transmissive. Each of these boundary polygons thus spawns a specular reflection beam and a diffuse reflection beam (not shown in FIGS. 8 and 9). These specular reflection beams, $R_a$, $R_e$, $R_f$, $R_i$, and $R_g$, and diffuse reflection beams $DR_a$, $DR_e$, $DR_f$, $DR_i$, and $DR_g$, are encoded in the beam tree structure shown in FIG. 12. Furthermore, when the beam tracing unit 14 traces beams via depth-first traversal of the cell adjacency graph, beam tree nodes are created representing the transmission path $T_n$, which spawns specular reflection path $R_d$ and diffuse reflection path $DR_d$, and diffraction paths $D_{hg}$ and $D_{hi}$ as illustrated in FIG. 12.

Path Generation

During an interactive session, in which a user navigates a simulated observer (receiver) through a virtual environment, propagation paths from a particular source point, S, to the moving receiver point, R, can be generated in real-time via lookup in the beam tree data structure described above. Path generation will be described with reference to the example shown in FIG. 13 and the flowchart shown in FIG. 14. First, the path generation unit 16 accesses the beam tree data structure, the cell adjacency graph, and the receiver position/direction information at step 402. Next, the cell containing the receiver point R is found by a logarithmic-time search of the BSP at Step 404.

Steps 406, 408, and 410, check each beam tree node, T, associated with that cell to see whether beam data is stored for node T which contains the receiver point R. If so, a viable ray path from the source point S to the receiver point R has been found, and the ancestors of node T in the beam tree explicitly encode the set of reflections, transmissions, and diffractions through the boundaries of the spatial subdivision that a ray must traverse to travel from the source point S to the receiver point R along this path (more generally, to any point inside the beam stored with T).

Figure 13:
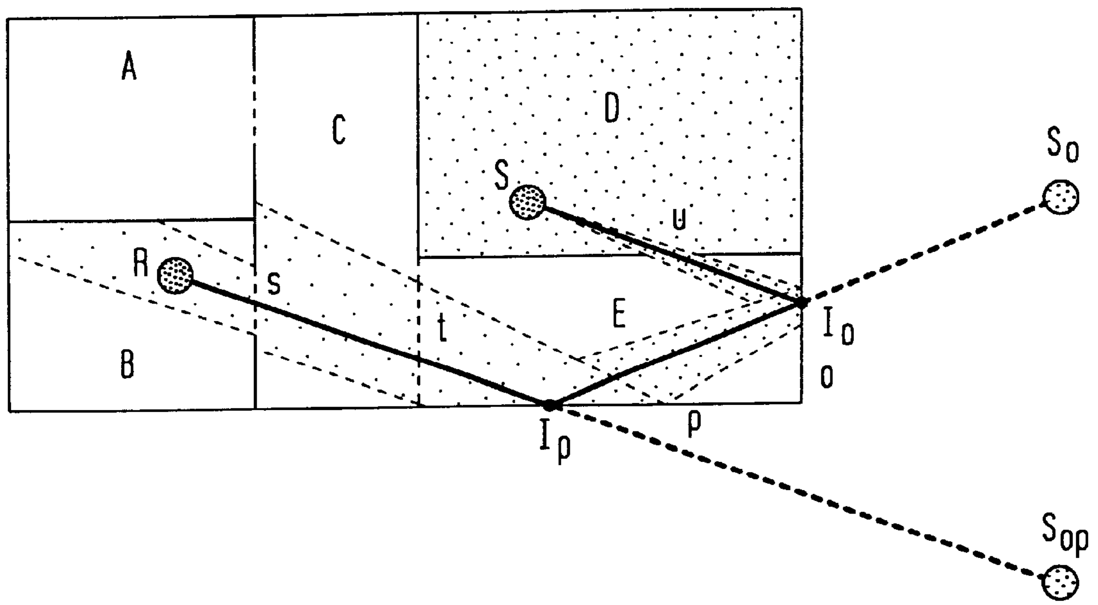
FIG. 13 illustrates propagation paths from a source point to a receiver point computed via look-up in a beam tree data structure according to the present invention.
Figure 14:
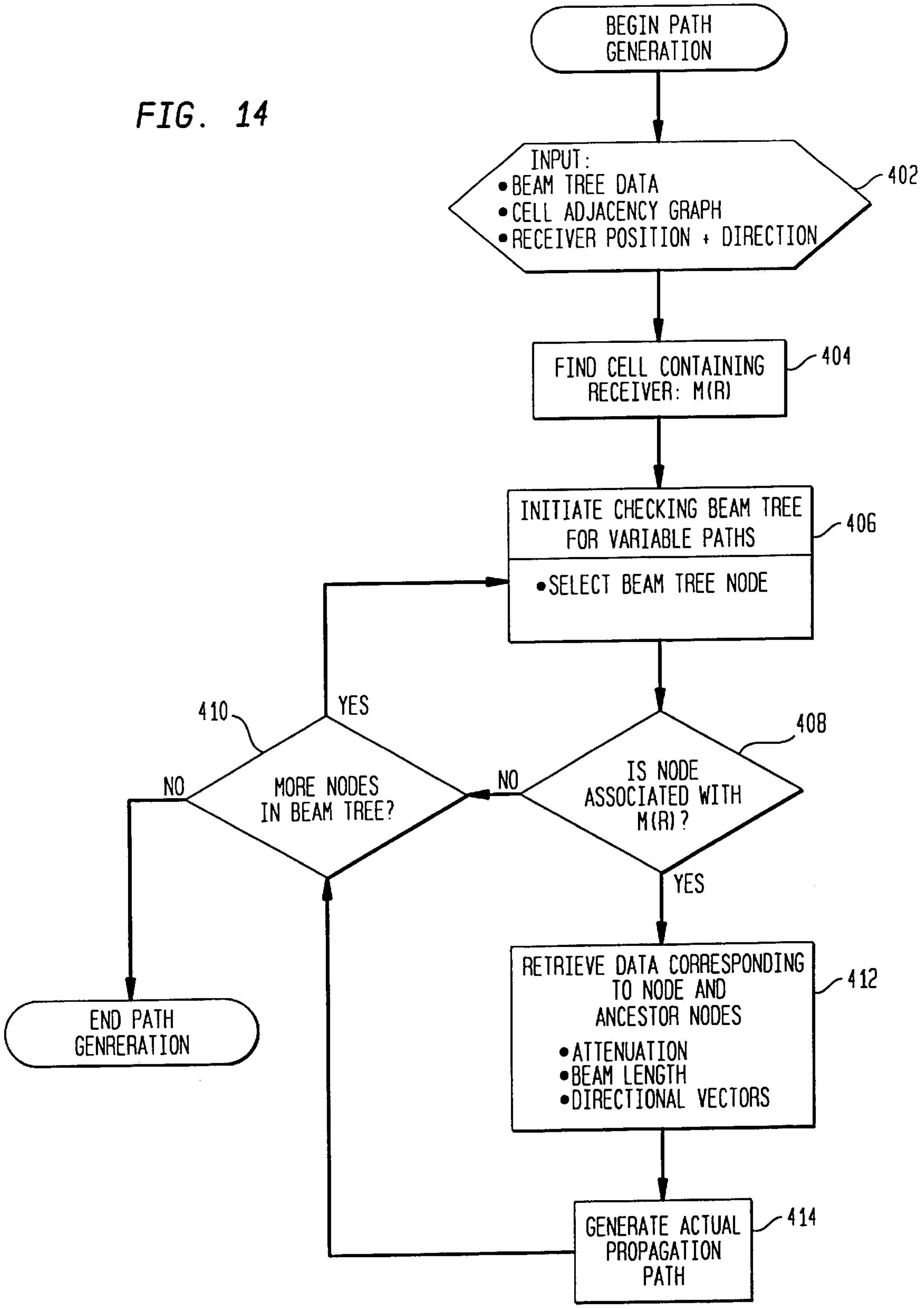
FIG. 14 is a flowchart for the path generating method according to the present invention.

A filter response (representing, for example, the absorption and scattering resulting from beam intersection with cell boundaries) for the corresponding propagation path can be derived quickly from the data stored with the beam tree node, T, and its ancestors in the beam tree. FIG. 13 shows the propagation path to a particular receiver point, R, for the input model and source position of FIG. 7. The actual ray path from the source point S to the receiver point R is generated by iterative intersection with a reflecting cell boundary stored with the ancestors of T.

Auralization/Display

To utilize the results from the path generation unit 16 in an interactive virtual environment, the auralization and display unit 18 simulates the effect of a sound source S (or a set of 1 sound sources) at the receiver location (i.e., auralization). The auralization and display unit 18 may also show a designer possible paths between a source and a receiver on a display to aid their design analysis.

1. Auralization

Since acoustic waves arriving along different paths add coherently (i.e., the delays created by wave propagation along different paths alter the sound recreated at the receiver location), time propagation delays caused along propagation paths must be taken into account to achieve realistic auralization. Once a set of propagation paths from a source point to the receiver location has been computed, the auralization and display unit 18 thus generates a source-receiver impulse response by adding the collective impulse responses along the time axis for each distinct path from source to receiver.

In the simplified case of modeling each path to account for simple delay and attenuation, the aggregate impulse response is the sum of weighted impulses along the time axis, where the weight represents the attenuation due to spherical wave spreading and wall absorption. The delay Δ, associated with each pulse is given by:

$$\Delta=L/C, \quad (1)$$

where L is the length of the corresponding propagation path, and C is the speed of sound. Since the pulse is attenuated by every reflection and dispersion, the amplitude, α, of each pulse is given by:

$$\alpha=A/L, \quad (2)$$

where A is the product of all the frequency-independent reflectivity and transmission coefficients for each of the reflecting and transmitting surfaces along the corresponding propagation path.

It will be evident that more complex filter responses for viable propagation paths may be generated to account for such factors as frequency-dependent absorption, angle-dependent absorption, and scattering (i.e., diffraction and diffuse reflection). Although such complex filter responses require additional computations, the computational savings achieved by the present path generation method allow such complex filter responses to be utilized without sacrificing interactive processing rates.

At the receiver, multi-channel (e.g., stereo, or surround-sound) impulse responses are computed by spatially filtering the individual paths into a multitude of prescribed directions. For the simple case of binaural reproduction (i.e., separate impulse responses for the left and right ears), the paths are weighted by two spatial filters that may, for example, have a cardioid directivity (CD) function given by:

$$CD_{1,2}=½(1+/-\cos(\theta)), \quad (3)$$

where θ is the angle of arrival of the pulse with respect to the normal vector pointing out of the ear. This approximation to actual head scatter and diffraction is similar to the standard two-point stereo microphone technique used in high fidelity audio recording.

Figure 15:
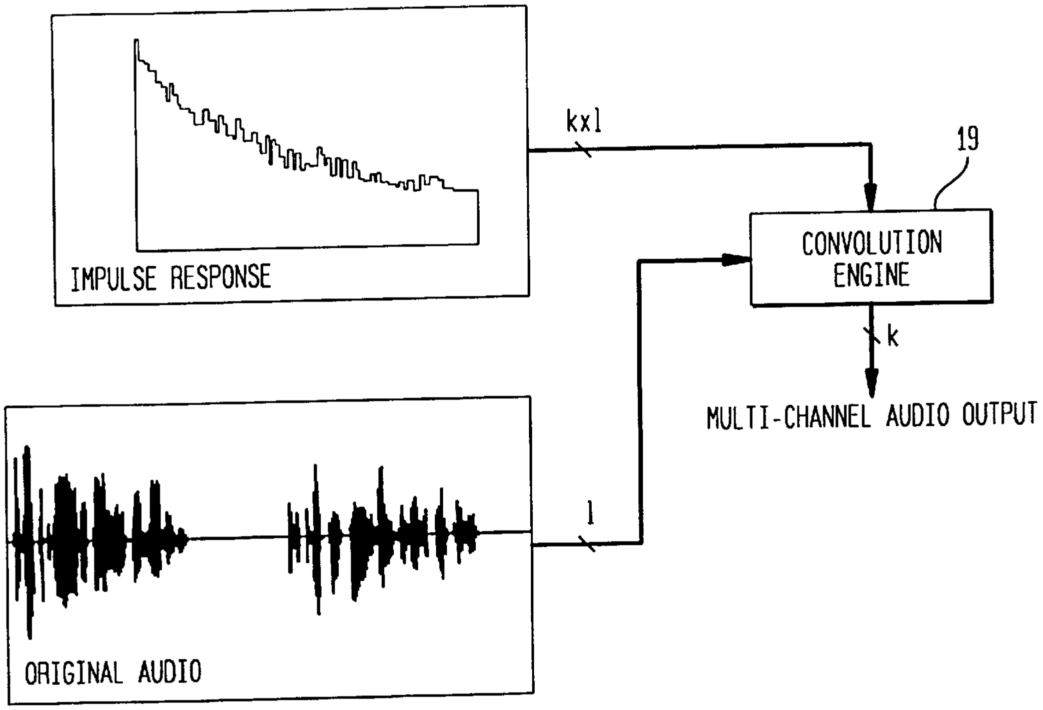
FIG. 15 illustrates auralization of an original audio signal using an source-receiver impulse response computed to represent various propagation paths.

Finally, the convolution engine 19 illustrated in FIG. 15 convolves the original (undistorted) audio signal of the source being simulated with the multi-channel impulse responses to produce spatialized audio signals. Separate, concurrently executing processors may be used to convolve the computed multi-channel impulse responses with the original audio signal, or parts of these impulse responses with the original audio signal, or for later computations of the combined total multi-channel impulse responses. In order to support real-time auralization, transfer of the impulse responses from the path generation processor to the convolution processor may utilize double buffers synchronized by a semaphore. Each new pair of impulse responses is loaded by the path generation processor into a "back buffer" as the convolution processor continues to access the current impulse responses stored in the "front buffer." A semaphore is thus used to synchronize the concurrently executing processors as the front and back buffer are switched.

2. Display

Figure 16:
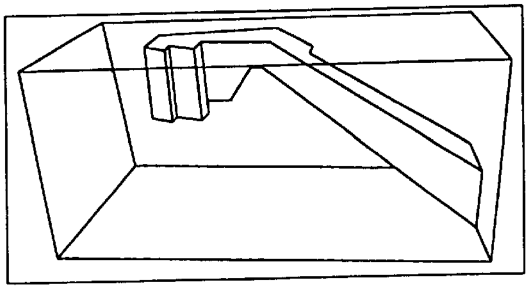
FIG. 16 illustrates a beam path display in 3D generated in accordance with the present invention.

The present system also supports interactive display of the computed propagation paths and beam tree data structures. After a beam tree has been constructed, the user may use the mouse to move the receiver point while the program updates display of propagation paths at interactive rates. Menu and keyboard commands may be used to toggle display of the following entities: (1) input polygons, (2) source points, (3) receiver points, (4) boundaries of the spatial subdivision, (5) pyramidal beams, (6) image sources, and (7) propagation paths. An example of a 3D display of a beam path from a source through a series of transmission and refection events is shown FIG. 16.

The user may select any propagation path for further inspection by clicking on it with the mouse. For the selected propagation path, the user can independently toggle display of reflecting cell boundaries, transmitting cell boundaries, and the associated set of pyramidal beams.

The user may also use the system to display acoustic modeling information in various pop-up windows. For instance, one window may be used to show a plot of the impulse response before a source with real-time updates as the user moves the receiver interactively with a mouse. Another display window may show real-time updates of various acoustic measures, including power, clarity, etc. Any of these acoustic measures may be quickly computed for a set of receiver locations on a regular planar grid (using repeated path generation from pre-computed beam trees), enabling visualization with a textured polygon. The combined grid-base visualization of acoustic measures with interactive path displays may be extremely valuable for understanding the acoustic properties of complex environments.

Computer Implementation

Figure 17:
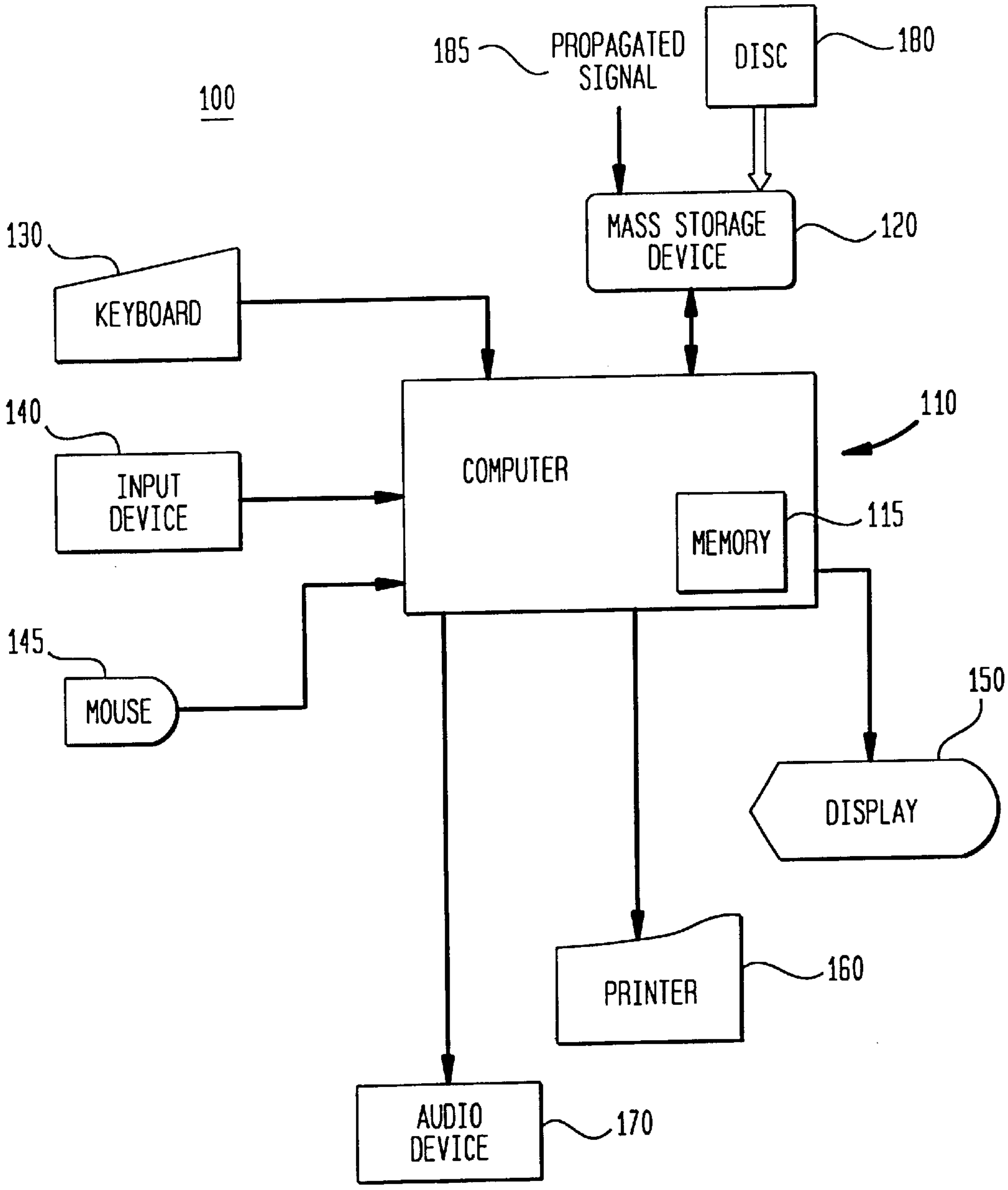
FIG. 17 is a block diagram of a computer system for implementing acoustic modeling in accordance with the present invention.
Figure 18A:
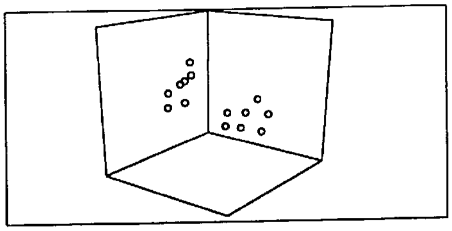
FIGS. 18(*a*)–(*f*) illustrate a series of input models of increasing levels of geometric complexity used to test computation rates.
Figure 18B:
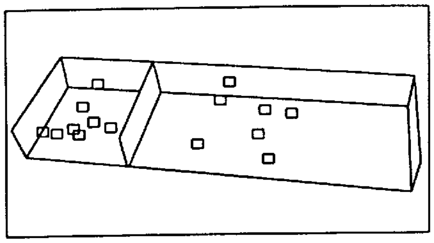
Figure 18C:
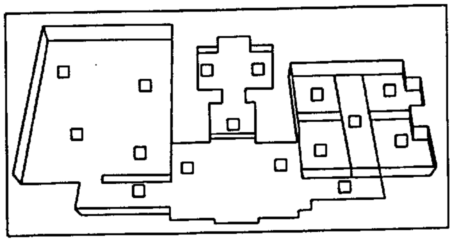
Figure 18D:
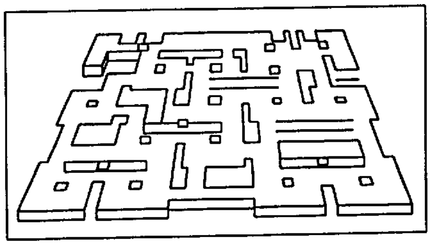
Figure 18E:
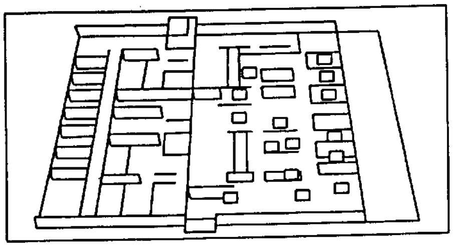
Figure 18F:
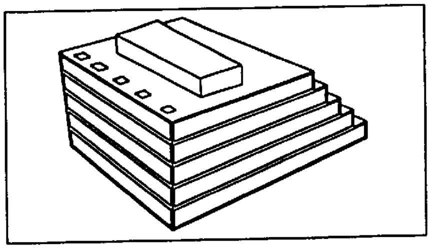

A computer system suitable for implementing the acoustic modeling and auralization method according to the present invention is shown in the block diagram of FIG. 17. The computer 110 is preferably part of a computer system 100.

To allow human interaction with the computer 110, the computer system includes a keyboard 130 and a mouse 145. As mentioned above, the mouse 145 may be used to move the receiver location during an interactive modeling application.

Because the invention may be applied in immersive virtual environments such as 3D video games, the computer system 100 also includes an input device 140 (e.g., a joystick) which allows the user to input updated orthogonal coordinate values representing a receiver location. For outputting visualized modeling results, the computer system 100 also includes a display 150 such as a cathode ray tube or a flat panel display, and a printer 160. Furthermore, to achieve auralization, the computer system 100 includes an audio output device 170 such as a speaker system.

The computer system 100 also includes a mass storage device 120, which may be, for example, a hard disk, floppy disc, optical disc, etc. The mass storage device may be used to store a computer program which enables the acoustic modeling method to be executed when loaded in the computer 110. As an alternative, the mass storage device 120 may be a network connection or off-line storage which supplies a program to the computer.

More particularly, a program embodying the method of the present invention may be loaded from the mass storage device 120 into the internal memory 115 of the computer 110. The result is that the general purpose computer 110 is transformed into a special purpose machine which implements the acoustic modeling method of the present invention.

A computer-readable medium, such as the disc 180 in FIG. 17 may be used to load computer-readable code into the mass storage device 120, which may then be transferred to the computer 110. Alternatively, the computer-readable code may be provided to the mass storage device 120 as part of an externally supplied propagation signal 185 (e.g., received over a communication line through a modem or ISDN connection). In this way, the computer 110 may be instructed to perform the inventive acoustic modelling method disclosed herein.

Computation Results

Using the system described above, experiments were run on a Silicon Graphics Octane workstation with 640 MB memory and a 195 Mhz R10000 processor to show the computational load of the present acoustic modeling system (limited to transmission and specular reflection paths for purposes of these experiments) The test models used to assess computational complexity and speed ranged from a simple geometric box to a complex building. These test models, including: 1) a box, 2) two adjacent rooms, 3) a suite, 4) a maze, 5) a floor, and 6) a building, are illustrated in FIGS. 18(*a*)–18(*f*) respectively.

1. Spatial Subdivision

Initially, a spatial subdivision data structure was constructed for each test model. Statistics from this phase of the process are shown in Table 1. Column 2 lists the number of input polygons in each model, while columns 3 and 4 contain the numbers of cells and links, respectively, generated by the spatial subdivision algorithm. Column 5 contains the time required by the algorithm to execute, while column 6 shows the storage requirements for the resulting spatial subdivision.

TABLE 1

Spatial Subdivision Statistics

| Model Name | # Polys | # Cells | # Links | Time (sec) | Storage (MB) |
|---|---|---|---|---|---|
| Box | 6 | 7 | 18 | 0.0 | 0.004 |
| Rooms | 20 | 12 | 43 | 0.1 | 0.029 |
| Suite | 184 | 98 | 581 | 3.0 | 0.352 |
| Maze | 602 | 172 | 1,187 | 4.9 | 0.803 |
| Floor | 1,772 | 814 | 5,533 | 22.7 | 3.310 |
| Bldg. | 10,057 | 4,512 | 31,681 | 186.3 | 18.694 |

Empirical results show that the number of cells and links created the spatial subdivision algorithm grow linearly with the number of input polygons for typical architectural models, rather than quadratically as is possible for worst case geometric arrangements. The time required to construct these spatial subdivisions grows super-linearly. It is dominated by the process of selecting splitting planes during BSP construction. The storage requirements of the spatial subdivision data structure are dominated by the vertices of link polygons. The spatial subdivision phase must be executed only once for each geometric model since these results are stored in a file, allowing rapid reconstruction in subsequent beam tracing executions.

2. Beam Tracing Results

For each test model, the beam tracing algorithm described above was executed for each different combination of 16 source locations and five termination criteria. The source locations were chosen to represent typical audio source positions. Furthermore, different limits on the maximum number of specular reflections were used (e.g., allowing up to 0, 1, 2, 4, or 8 reflections) as the sole termination criteria. As discussed above, however, other termination criteria based on attenuation or path length may be used in actual utilization.

TABLE 2

Beam Tracing Statistics

| Model | # | # | Beam Tracing | | Path | |
|---|---|---|---|---|---|---|
| Name | Polys | Rfl | # | Time | # | Time |
| Box | 6 | 0 | 1 | 0 | 1.0 | 0.0 |
| | | 1 | 7 | 1 | 7.0 | 0.1 |
| | | 2 | 37 | 3 | 25.0 | 0.3 |
| | | 4 | 473 | 42 | 129.0 | 6.0 |
| | | 8 | 10,036 | 825 | 833.0 | 228.2 |
| Rooms | 20 | 0 | 3 | 0 | 1.0 | 0.0 |
| | | 1 | 31 | 3 | 7.0 | 0.1 |
| | | 2 | 177 | 16 | 25.1 | 0.3 |
| | | 4 | 1,939 | 178 | 127.9 | 5.2 |
| | | 8 | 33,877 | 3,024 | 794.4 | 180.3 |
| Suite | 184 | 0 | 7 | 1 | 1.0 | 0.0 |
| | | 1 | 90 | 9 | 6.8 | 0.1 |
| | | 2 | 576 | 59 | 25.3 | 0.4 |
| | | 4 | 7,217 | 722 | 120.2 | 6.5 |
| | | 8 | 132,920 | 13,070 | 672.5 | 188.9 |
| Maze | 602 | 0 | 11 | 1 | 0.4 | 0.0 |
| | | 1 | 167 | 16 | 2.3 | 0.0 |
| | | 2 | 1,162 | 107 | 8.6 | 0.1 |
| | | 4 | 13,874 | 1,272 | 36.2 | 2.0 |
| | | 8 | 236,891 | 21,519 | 183.1 | 46.7 |
| Floor | 1,772 | 0 | 23 | 4 | 1.0 | 0.0 |
| | | 1 | 289 | 39 | 6.1 | 0.1 |
| | | 2 | 1,713 | 213 | 21.5 | 0.4 |
| | | 4 | 18,239 | 2,097 | 93.7 | 5.3 |
| | | 8 | 294,635 | 32,061 | 467.0 | 124.5 |
| Bldg. | 10,057 | 0 | 28 | 5 | 1.0 | 0.0 |
| | | 1 | 347 | 49 | 6.3 | 0.1 |
| | | 2 | 2,135 | 293 | 22.7 | 0.4 |
| | | 4 | 23,264 | 2,830 | 101.8 | 6.8 |
| | | 8 | 411,640 | 48,650 | 529.8 | 169.5 |

Table 2 illustrates the results generated during the beam tracing experiment. Each row represents an execution with a particular test model and termination criteria, average over 16 source locations. Columns 2 and 3 show the number of polygons describing each test model, and the maximum number of specular reflections allowed in each test, respectively. Column 4 contains the average number of beams traced (i.e., the average number of nodes in the resulting beam trees), and column 5 shows the average time for beam tracing to execute.

From the results listed in column 4, it can readily be seen that the number of beams traced does not grow at a rate proportional to the number of polygons in the model environment. This result is due to the fact that the presently disclosed beam tracing method traverses space through an adjacency graph of convex cells as described above. As each cell is visited, the next polygons are found in depth-sorted order by considering only the boundaries of the current cell. Empirically, in large embodiments with many concavities and occlusions, the number of boundaries on each cell is nearly constant, and a near constant number of cells are reached by each beam. These properties lead to near-constant expected-case complexity of the beam tracing algorithm according to the present invention, even with increasing numbers of input polygons.

This result is most readily understood by comparing the values in column 4 of Table 2 for the Floor and Building models (e.g., for up to 8 reflections). Although the Building model (10,057 polygons) has more than 5 times the complexity of the Floor model (1,772 polygons), the average number of beams traced from the same source location is only 1.2–1.4 larger for the Building model. This results because the complexity of the spatial subdivision, and most other parts of the building, are not reached by each beam. In other words, beam tracing is impacted only by local complexity, not global complexity. As a result, the presently disclosed beam tracing embodiment can be anticipated to have similar complexity if the entire building were 1,000 floors high, or in the city of 1,000 buildings.

Table 2 also shows that the number of beams traced by the presently disclosed acoustic modeling method does not grow at a rate of $n^r$ for n polygons and r reflections. This is because each beam narrows as it is clipped by the cell boundaries it has traversed. Beams that are deeper in the beam tree are narrower and tend to intersect fewer cell boundaries, and thus spawn fewer beams to trace recursively. In the limit, each beam becomes so narrow that it intersects only one cell boundary, on average, leading to a beam tree with a branching factor near 1.0. Statistics regarding the average branching factor at each depth in this beam tree are listed in Table 3. The average branching factor, shown in column 5, generally decreases with tree depth, rapidly approaching 1.0.

TABLE 3

| | Example Beam Tree Distribution | | | |
|---|---|---|---|---|
| Beam Tree Depth | # Total Nodes | # Interior Nodes | # Leaf Nodes | Average Branching Factor |
| 0 | 1 | 1 | 0 | 16.0000 |
| 1 | 16 | 16 | 0 | 6.5000 |
| 2 | 104 | 104 | 0 | 4.2981 |
| 3 | 447 | 446 | 1 | 2.9193 |
| 4 | 1302 | 1296 | 6 | 2.3920 |
| 5 | 3100 | 3092 | 8 | 2.0715 |
| 7 | 11835 | 11757 | 78 | 1.7126 |
| 10 | 27080 | 22514 | 4566 | 1.3841 |
| 12 | 36298 | 25245 | 11053 | 1.2924 |
| 15 | 25135 | 18122 | 7013 | 1.2042 |
| 18 | 12764 | 8242 | 4522 | 1.1777 |
| 20 | 7671 | 4849 | 2822 | 1.1400 |
| 25 | 2195 | 1340 | 855 | 1.4784 |
| 30 | 1199 | 371 | 828 | 1.7251 |
| 35 | 52 | 28 | 24 | 1.0357 |
| 40 | 7 | 6 | 1 | 1.0000 |
| 45 | 1 | 1 | 0 | 1.0000 |
| 50 | 1 | 1 | 0 | 1.0000 |

3. Path Generation Results

Experiments quantify the complexity of generating propagation paths from pre-computed beam trees such as those illustrated above. For each beam tree constructed in the previous experiment, statistics were logged during generation of specular propagation paths to 16 different receiver locations. Receivers were chosen randomly within a 2-foot sphere around the source to present a typical audio scenario in which the source and receiver are in close proximity in the same room. This can be said to represent a worse-case scenario because fewer paths would likely be found to more remote and more occluded receiver locations.

Columns 6 and 7 of Table 2 contain statistics gathered during path generation for each combination of model and termination criteria averaged over all 256 source-receiver pairs (i.e., 16 receivers for each of the 16 sources). Column 6 contains the average number of propagation paths generated, while column 7 shows the average time (in milliseconds) for executing path generation. The number of specular reflection paths between a source and receiver in close proximity of one another is nearly constant across all of the test models. Also, the time required by the path generation method disclosed herein does not generally depend on the number of polygons in the environment, nor does it depend on the total number of nodes in the pre-computed beam tree discussed above. This result is due to the fact that the path generation method according to the present invention considers only nodes of the beam tree with beams residing inside the cell that contains the receiver location. Therefore, the computation time required is not dependent on the complexity of the entire environment, but instead only on the number of beams that traverse the receiver cell. Overall, column 6 shows that the present method supports generation of specular reflection paths between a fixed source and any (i.e., arbitrarily moving) receiver at interactive rates, even for up to 8th order reflections in an environment with more than 10,000 polygons.

Compared to previous beam tracing methods for acoustic modeling, the present method takes unique advantage of pre-computation and convexity, pre-computation being used twice, once to encode in the spatial subdivision data structure a depth-ordered sequence of (cell boundary) polygons to be considered during any traversal of space, and once to encode in the beam tree data structure the region of space reachable from this source by each particular sequence of reflections, transmission, and diffraction events at cell boundaries. The present method uses the convexity of the beams, cell regions, and cell boundary polygons to enable efficient and robust computation of beam-polygon and beam-receiver intersections. The beam tree contains only convex beams and is indexed by convex cells of the BSP spatial subdivision, enabling the system to evaluate propagation paths from a fixed source to an arbitrary receiver location at interactive rates. Furthermore, while the beam tracing examples discussed above assume a fixed source and a movable receiver location, beams may likewise be traced from a fixed receiver location to a movable source in the same manner.

As a result, the presently disclosed acoustic modeling system is uniquely able to: (1) support evaluation of propagation paths at interactive rates, (2) scale to compute high-order reflections in large environments, and (3) compute paths of diffraction and diffuse reflection. The system of the present invention thus can integrate real-time auralization with visualization of large virtual environments.

By providing acoustic simulations at interactive rates, the above-described method may further be implemented in a system which allows a user to analyze the psychoacoustic effects of variable acoustic modeling parameters. Thus, a user may interactively change various acoustic parameters (e.g., number of reflections) with real-time auralization and display feedback.

What is claimed is:

1. A method of modeling coherent wave propagation between a source point and a receiver location in a spatial environment comprising:

accessing a pre-computed data structure which represents wave propagation paths between a fixed point and various regions of said spatial environment, said pre-computed data structure being formed by tracing beams through said spatial environment by traversing a cell adjacency graph which represents neighbor relationships between regions of said spatial environment; and computing a filter response for a path between said source point and said receiver location at an interactive rate using said pre-computed data structure.

2. The method according to claim 1, wherein said method models an acoustic propagation path between an audio source and said receiver location.

3. The method according to claim 1, wherein said fixed point is said source point and said receiver location is interactively moved by a user.

4. The method according to claim 1, wherein said fixed point is said receiver location and said source point is interactively moved by a user.

5. The method according to claim 1, further comprising:

creating an impulse response corresponding to said filter response; and convolving said impulse response with a source signal to generate a spatialized output signal.

6. The method according to claim 1, wherein said pre-computed data structure is a beam tree which encodes propagation paths between said fixed point and various regions of said spatial environment.

7. The method according to claim 6, wherein said encoded propagation paths include at least one of diffraction and diffuse reflection events.

8. The method according to claim 1, wherein said filter response incorporates at least one of: frequency-dependent absorption, angle dependent absorption, and scattering, which occurs along said path between said source point and said receiver location.

9. The method according to claim 1, wherein said method models propagation path(s) between one or more source points and one or more receiver locations.

10. A method of modeling coherent wave propagation in a spatial environment comprising:

accessing a cell-adjacency data structure which represents neighbor relationships between regions of said spatial environment; and tracing beams from a fixed point to various regions of said spatial environment by traversing said cell-adjacency data structure.

11. The method according to claim 10, wherein said method models acoustic reverberation of a sound originating at an audio point source.

12. The method according to claim 10, further comprising:

creating a beam tree data structure which encodes beam paths from said fixed point to various regions of said spatial environment.

13. The method according to claim 12, further comprising:

partitioning said spatial environment into cells bound by polygonal surfaces, wherein said cell adjacency data structure indicates polygonal surfaces which are shared by adjacent cells.

14. The method according to claim 13, wherein said beam-tree data structure includes a number of nodes which store: 1) a reference to the cell of said cell adjacency data structure being traversed; and 2) the polygonal surface most recently traversed.

15. The method according to claim 12, further comprising:

inputting a movable position; and generating at least one path between said fixed point and said movable position via lookup in said beam tree data structure.

16. The method according to claim 15, wherein said movable position is a receiver location which a user interactively changes as said generating step operates in real-time to update the paths between said fixed point and said moving receiver location.

17. The method according to claim 15, further comprising:

outputting a spatialized output signal by creating an impulse response representing at least one propagation path between said fixed point and said movable position, and convolving said impulse response with an original signal.

18. The method according to claim 10, wherein said tracing step traces beams along paths of transmission and specular reflection.

19. The method according to claim 10, wherein said tracing step traces beams along paths of diffraction.

20. The method according to claim 19, wherein a diffraction path is traced when a beam impinges a surface discontinuity by considering said surface discontinuity as a new wave source.

21. The method according to claim 10, wherein said tracing step traces beams along paths of diffuse reflection.

22. The method according to claim 21, wherein a diffuse reflection path is traced when a beam intersects a reflective polygonal surface by considering the region of said reflective polygonal surface which intersects said beam as a new wave source.

23. The method according to claim 10, wherein said method models propagation path(s) between one or more source points and one or more receiver locations.

24. A system of modeling coherent wave propagation between a source point and a receiver location in a spatial environment comprising:

input means for inputting a pre-computed data structure which represents wave propagation paths between a fixed point and various regions of said spatial environment, said pre-computed data structure being formed by tracing beams through said spatial environment by traversing a cell adjacency graph which represents neighbor relationships between regions of said spatial environment; and processing means for computing a filter response for a path between said source point and said receiver location at an interactive rate using said pre-computed data structure.

25. The system according to claim 24, wherein said system models an acoustic propagation path between an audio source and said receiver location.

26. The system according to claim 24, wherein said fixed point is said source point and said receiver location is interactively moved by a user.

27. The system according to claim 24, wherein said fixed point is said receiver location and said source point is interactively moved by a user.

28. The system according to claim 24, further comprising:

means for creating an impulse response corresponding to said filter response; and convolving means for convolving said impulse response with a source signal to generate a spatialized output signal.

29. The system according to claim 24, wherein said pre-computed data structure is a beam tree which encodes propagation paths between said fixed point and various regions of said spatial environment.

30. The system according to claim 29, wherein said encoded propagation paths include at least one of diffraction and diffuse reflection events.

31. The system according to claim 24, wherein said filter response incorporates at least one of: frequency-dependent absorption, angle dependent absorption, and scattering, which occurs along said path between said source point and said receiver location.

32. The system according to claim 24, wherein said system models propagation path(s) between one or more source points and one or more receiver locations.

33. A system of modeling coherent wave propagation in a spatial environment comprising:

input means for inputting a cell-adjacency data structure which represents neighbor relationships between regions of said spatial environment; and beam tracing means for tracing beams from a fixed point to various regions of said spatial environment by traversing said cell adjacency data structure.

34. The system according to claim 33, wherein said system models acoustic reverberation of a sound originating at an audio point source.

35. The system according to claim 33, wherein said beam tracing means creates a beam tree data structure encoding beam paths from said fixed point to various regions of said spatial environment.

36. The system according to claim 35, further comprising:

partition means for partitioning said spatial environment into cells bound by polygonal surfaces, wherein said cell adjacency data structure indicates polygonal surfaces which are shared by adjacent cells.

37. The system according to claim 36, wherein said beam tree data structure includes a number of nodes which store: 1) a reference to the cell of said cell-adjacency data structure being traversed; and 2) the polygonal surface most recently traversed.

38. The system according to claim 35, further comprising:

means for inputting a movable position; and path generation means for generating at least one path between said fixed point and said movable position via lookup in said beam-tree data structure.

39. The system according to claim 38, wherein said movable position is a receiver location which a user interactively changes as said path generation means operates in real-time to update the paths between said fixed point and said moving receiver location.

40. The system according to claim 38, further comprising:

means for generating a spatialized output signal by creating an impulse response representing a filter response along at least one propagation path between said fixed point and said movable position, and convolving said impulse response with an original signal.

41. The system according to claim 38, wherein said beam tracing means traces beams along paths of transmission and specular reflection.

42. The system according to claim 33, wherein said beam tracing means traces beams along paths of diffraction.

43. The system according to claim 42, wherein said beam tracing means traces a diffraction path when a beam impinges a surface discontinuity by considering said surface discontinuity as a new wave source.

44. The system according to claim 33, wherein said beam tracing means traces beams along paths of diffuse reflection.

45. The system according to claim 44, wherein said beam tracing means traces a diffuse reflection path when a beam intersects a reflective polygonal surface by considering the region of said reflective polygonal surface which intersects said beam as a new wave source.

46. The system according to claim 33, wherein said system models propagation path(s) between one or more source points and one or more receiver locations.

* * * * *